(12) United States Patent
Fujimura et al.

(10) Patent No.: US 7,799,489 B2
(45) Date of Patent: *Sep. 21, 2010

(54) METHOD FOR DESIGN AND MANUFACTURE OF A RETICLE USING VARIABLE SHAPED BEAM LITHOGRAPHY

(75) Inventors: Akira Fujimura, Saratoga, CA (US); Michael Tucker, Los Altos, CA (US)

(73) Assignee: D2S, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/540,323

(22) Filed: Aug. 12, 2009

(65) Prior Publication Data

US 2010/0055581 A1     Mar. 4, 2010

Related U.S. Application Data

(63) Continuation-in-part of application No. 12/473,241, filed on May 27, 2009, and a continuation-in-part of application No. 12/202,364, filed on Sep. 1, 2008.

(60) Provisional application No. 61/225,207, filed on Jul. 13, 2009.

(51) Int. Cl.
*G03F 9/00* (2006.01)
(52) U.S. Cl. .............................. 430/5; 430/30; 430/296; 430/942; 716/19
(58) Field of Classification Search ............. 430/5, 430/30, 296, 942; 716/19
See application file for complete search history.

(56) References Cited

U.S. PATENT DOCUMENTS

| | | | |
|---|---|---|---|
| 4,712,013 A | 12/1987 | Nishimura | |
| 5,082,762 A | 1/1992 | Takahashi | |
| 5,804,339 A | 9/1998 | Kim | |
| 5,885,747 A | 3/1999 | Yamasaki et al. | |
| 6,049,085 A | 4/2000 | Ema | |
| 6,087,046 A | 7/2000 | Nakasuji | |
| 6,291,119 B2 | 9/2001 | Choi et al. | |
| 6,544,700 B2 | 4/2003 | Ogino | |
| 6,610,989 B1 | 8/2003 | Takahashi | |
| 6,677,089 B2 | 1/2004 | Ogino et al. | |
| 6,982,135 B2 | 1/2006 | Chang et al. | |
| 2002/0036273 A1 | 3/2002 | Okino | |
| 2007/0114453 A1 | 5/2007 | Emi et al. | |
| 2007/0187624 A1 | 8/2007 | Suzuki et al. | |
| 2007/0196768 A1 | 8/2007 | Ogino | |
| 2008/0116398 A1 | 5/2008 | Hara et al. | |
| 2008/0116399 A1 | 5/2008 | Fujimura | |
| 2008/0118852 A1 | 5/2008 | Mitsuhashi | |
| 2008/0128637 A1 | 6/2008 | Yoshida | |

FOREIGN PATENT DOCUMENTS

| JP | 1992155337 | 5/1992 |
|---|---|---|
| JP | 2008-066441 A | 3/2008 |

OTHER PUBLICATIONS

Bloecker, M. et al., "Metrics to Assess Fracture Quality for Variable Shaped Beam Lithography", Proceedings of SPIE, vol. 6349 (2006), pp. 63490Z-1-63490Z-10, P.O. Box 10, Bellingham, WA. 98227, U.S.A.

International Search Report and the Written Opinion of the International Searching Authority, Application No. PCT/US2009/053327, mailed Mar. 2, 2010.

International Search Report and Written Opinion of the International Searching Authority. Application No. PCT/US2009/054229. Mailed Mar. 2, 2010.

International Search Report and Written Opinion of the International Searching Authority. Application No. PCT/US2009/054239. Mailed Mar. 18, 2010.

*Primary Examiner*—Christopher G Young
(74) *Attorney, Agent, or Firm*—The Mueller Law Office, P.C.

(57) ABSTRACT

A method is disclosed for using non-overlapping variable shaped beam (VSB) shots in the design and manufacture of a reticle, where the union of the plurality of shots deviates from the desired pattern. Methods are described for fracturing or mask data preparation or proximity effect correction of a desired pattern to be formed on a reticle; for forming a pattern on a reticle using charged particle beam lithography; and for optical proximity correction (OPC) of a desired pattern. Dosages of the shots may be allowed to vary with respect to each other. The plurality of shots may be determined such that a pattern on the surface calculated from the plurality of shots is within a predetermined tolerance of the desired pattern. In some embodiments, an optimization technique may be used to minimize shot count.

25 Claims, 17 Drawing Sheets

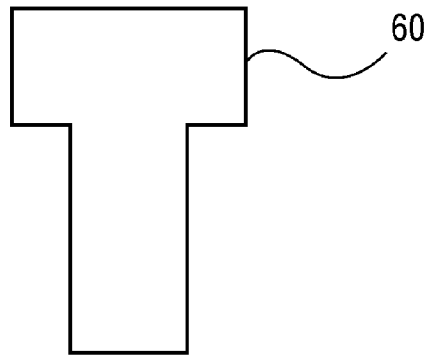
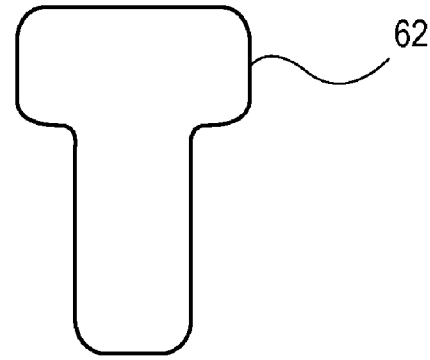
FIG. 5A  FIG. 5B
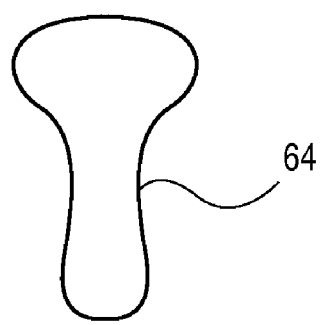
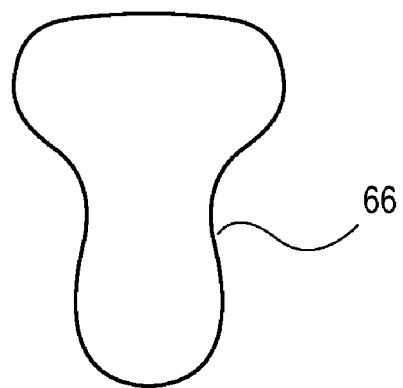
FIG. 5C  FIG. 5D

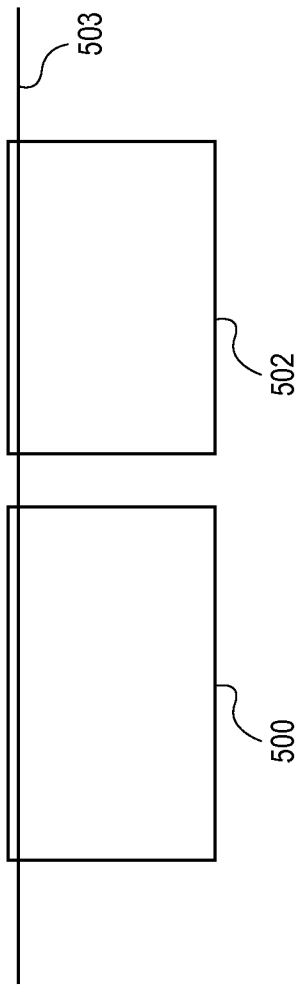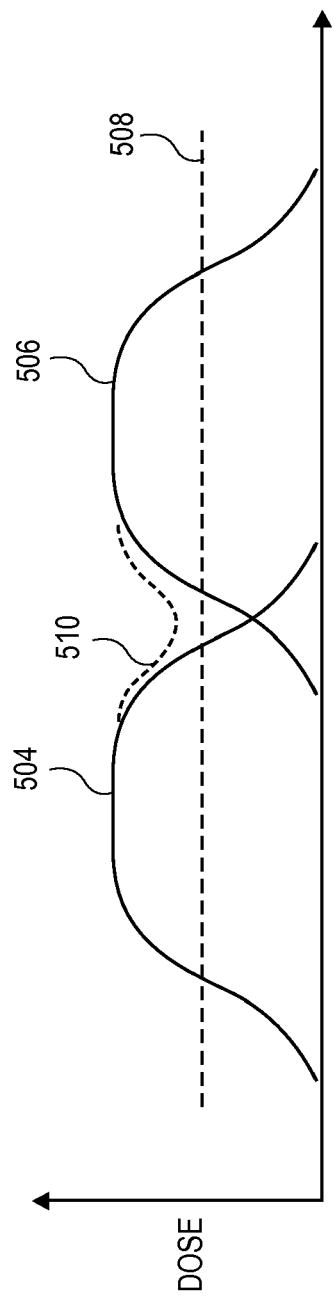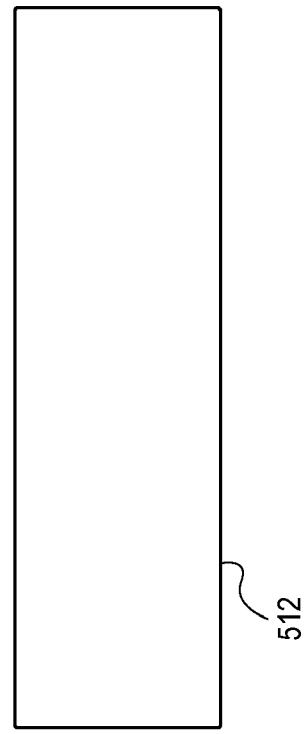

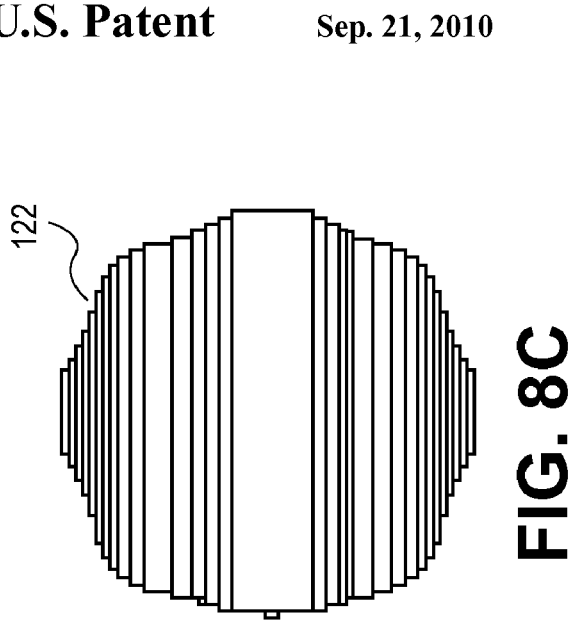
FIG. 8C
FIG. 8B
FIG. 8A
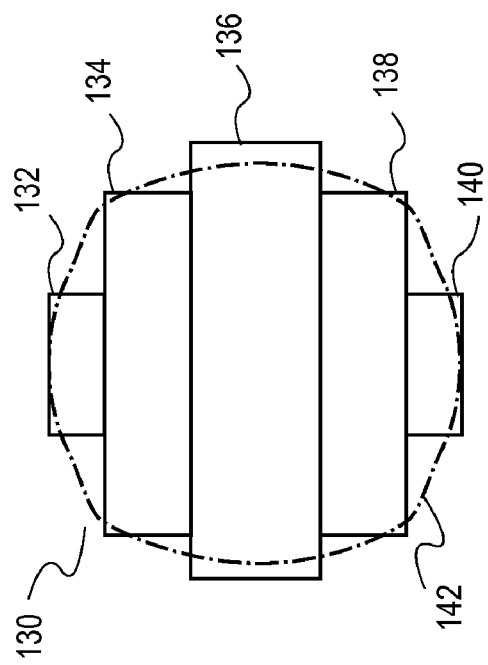
FIG. 8E
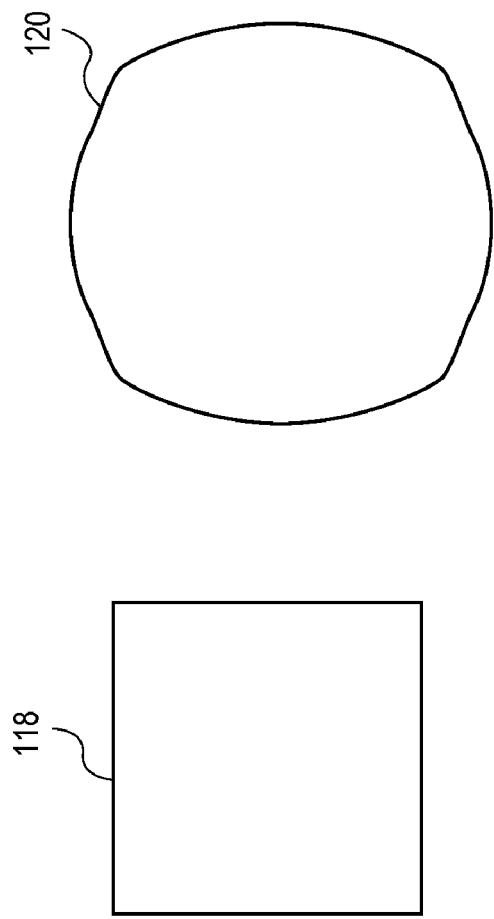
FIG. 8D

FIG. 13A

| 0.0 | 0.1 | 0.1 | 0.2 | 0.2 | 0.2 | 0.2 | 0.1 | 0.1 | 0.0 |
|---|---|---|---|---|---|---|---|---|---|
| 0.1 | 0.3 | 0.4 | 0.5 | 0.5 | 0.5 | 0.5 | 0.4 | 0.3 | 0.1 |
| 0.1 | 0.4 | 0.7 | 0.8 | 0.8 | 0.8 | 0.8 | 0.7 | 0.4 | 0.1 |
| 0.2 | 0.5 | 0.8 | 1.0 | 1.0 | 1.0 | 1.0 | 0.8 | 0.5 | 0.2 |
| 0.2 | 0.5 | 0.8 | 1.0 | 1.0 | 1.0 | 1.0 | 0.8 | 0.5 | 0.2 |
| 0.1 | 0.4 | 0.7 | 0.8 | 0.8 | 0.8 | 0.8 | 0.7 | 0.4 | 0.1 |
| 0.1 | 0.3 | 0.4 | 0.5 | 0.5 | 0.5 | 0.5 | 0.4 | 0.3 | 0.1 |
| 0.0 | 0.1 | 0.1 | 0.2 | 0.2 | 0.2 | 0.2 | 0.1 | 0.1 | 0.0 |

FIG. 13B

| 0.0 | 0.1 | 0.1 | 0.1 | 0.1 | 0.1 | 0.1 | 0.1 | 0.1 | 0.1 | 0.1 | 0.1 | 0.1 | 0.0 |
|---|---|---|---|---|---|---|---|---|---|---|---|---|---|
| 0.1 | 0.1 | 0.2 | 0.2 | 0.2 | 0.2 | 0.2 | 0.2 | 0.2 | 0.2 | 0.2 | 0.2 | 0.1 | 0.1 |
| 0.1 | 0.2 | 0.4 | 0.5 | 0.5 | 0.5 | 0.5 | 0.5 | 0.5 | 0.5 | 0.5 | 0.4 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.5 | 0.6 | 0.6 | 0.6 | 0.6 | 0.6 | 0.6 | 0.6 | 0.6 | 0.5 | 0.2 | 0.1 |
| 0.1 | 0.2 | 0.4 | 0.5 | 0.5 | 0.5 | 0.5 | 0.5 | 0.5 | 0.5 | 0.5 | 0.4 | 0.2 | 0.1 |
| 0.1 | 0.1 | 0.2 | 0.2 | 0.2 | 0.2 | 0.2 | 0.2 | 0.2 | 0.2 | 0.2 | 0.2 | 0.1 | 0.1 |
| 0.0 | 0.1 | 0.1 | 0.1 | 0.1 | 0.1 | 0.1 | 0.1 | 0.1 | 0.1 | 0.1 | 0.1 | 0.1 | 0.0 |

METHOD FOR DESIGN AND MANUFACTURE OF A RETICLE USING VARIABLE SHAPED BEAM LITHOGRAPHY

RELATED APPLICATIONS

This application: 1) is a continuation-in-part of U.S. patent application Ser. No. 12/202,364 filed Sep. 1, 2008, entitled "Method And System For Manufacturing A Reticle Using Character Projection Particle Beam Lithography"; 2) is a continuation-in-part of U.S. patent application Ser. No. 12/473,241 filed May 27, 2009, entitled "Method For Manufacturing A Surface And Integrated Circuit Using Variable Shaped Beam Lithography"; 3) claims priority from U.S. Provisional Patent Application Ser. No. 61/225,207 filed Jul. 13, 2009, entitled "Method For Design And Manufacture Of A Reticle Using Variable Shaped Beam Lithography"; and 4) is related to U.S. patent application Ser. No. 12/540,328 entitled "Method For Design and Manufacture Of A Reticle Using A Two-Dimensional Dosage Map And Charged Particle Beam Lithography" filed on Aug. 12, 2009; all of which are hereby incorporated by reference for all purposes.

BACKGROUND OF THE DISCLOSURE

The present disclosure is related to lithography, and more particularly to the design and manufacture of a surface which may be a reticle, a wafer, or any other surface, using variable shaped beam (VSB) charged particle beam lithography.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

As indicated, in optical lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of predetermined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimensions of the circuit pattern or physical design approaches the resolution limit of the optical exposure tool used in optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. For example, in a type of OPC called rule-based OPC, various geometric operations such as edge selection, area intersection or union, and oversizing or undersizing of shapes—i.e. moving the edges of each shape inward or outward—may be used to modify a designed pattern so as to improve the quality of the pattern after transfer by optical lithography. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed.

There are a number of technologies used for forming patterns on a reticle, including using optical lithography or charged particle beam lithography. The most commonly used system is the variable shaped beam (VSB), which is a type of charged particle beam writer system, where a precise electron beam is shaped and steered onto a resist-coated surface of the reticle. These shapes are simple shapes, usually limited to rectangles of certain minimum and maximum sizes and with sides which are parallel to the axes of a Cartesian coordinate plane, and triangles with their three internal angles being 45 degrees, 45 degrees, and 90 degrees of certain minimum and maximum sizes. At pre-determined locations, doses of electrons are shot into the resist with these simple shapes. The total writing time for this type of system increases with the number of shots. The doses or shots of electrons are conventionally designed: a) to completely cover the target pattern, b) to avoid overlap with each other, and c) to have a uniform initially-assigned dosage prior to a subsequent dosage correction step, such as proximity error correction. These three restrictions greatly simplify calculation of how the resist on the reticle will register the pattern. As OPC features become more complex, however, the division or fracturing of patterns into a set of non-overlapping simple shapes can result in many billions of simple shapes, resulting in very long reticle write times.

It would be advantageous to reduce the time and expense it takes to prepare and manufacture a reticle that is used for manufacturing a substrate. More generally, it would be advantageous to reduce the time and expense it takes to prepare and manufacture any surface. For example, it would be desirable to reduce the number of VSB shots required to form the patterns on a reticle.

SUMMARY OF THE DISCLOSURE

A method for fracturing or mask data preparation or proximity effect correction of a desired pattern to be formed on a reticle is disclosed in which a plurality of non-overlapping variable shaped beam (VSB) shots are determined which can form the desired pattern, where the union of the plurality of shots deviates from the desired pattern. Dosages of the shots may be allowed to vary with respect to each other. The plurality of shots may be determined such that a pattern on the surface calculated from the plurality of shots is within a predetermined tolerance of the desired pattern. In some embodiments, an optimization technique may be used to minimize shot count. In other embodiments, the plurality of shots may be optionally selected from one or more pre-computed VSB shots or groups of VSB shots, that is, glyphs.

A method for forming a pattern on a reticle using a plurality of non-overlapping VSB shots is also disclosed, wherein the dosages of the shots may be allowed to vary with respect to each other, and wherein the union of the plurality of shots deviates from the desired pattern.

A method for optical proximity correction (OPC) of a desired pattern for a substrate is also disclosed in which a plurality of non-overlapping variable shaped beam (VSB) shots are determined which can form on a surface an OPC-corrected version of the desired substrate pattern, where the union of the plurality of shots deviates from the desired pattern. The initially-assigned dosages of the shots are allowed to vary.

These and other advantages of the present disclosure will become apparent after considering the following detailed specification in conjunction with the accompanying drawings.

BRIEF DESCRIPTION OF THE DRAWINGS

FIG. 5A illustrates a design of a pattern to be formed on a substrate;

FIG. 5B illustrates the pattern of FIG. 5A formed on a surface using a normal dose;

FIG. 5C illustrates the pattern of FIG. 5A formed on a surface using a less than normal dose;

FIG. 5D illustrates the pattern of FIG. 5A formed on a surface using a greater than normal dose;

FIG. 6A illustrates two VSB shots in close proximity to each other;

FIG. 6B illustrates a graph of the dose along a line drawn through the shapes of FIG. 6A;

FIG. 6C illustrates the resultant pattern on the surface from the shots of FIG. 6A;

FIG. 8A illustrates a design of a square pattern;

FIG. 8B illustrates the pattern of FIG. 8A after OPC;

FIG. 8C illustrates a fracturing of the pattern of FIG. 8B into conventional non-overlapping rectangles;

FIG. 8D illustrates a fracturing of the pattern of FIG. 8B into conventional non-overlapping rectangles without slivers;

FIG. 8E illustrates an exemplary fracturing of the pattern of FIG. 8B into non-overlapping rectangles according to the present disclosure;

FIG. 13A illustrates a glyph dosage map from a rectangular VSB shot;

FIG. 13B illustrates a glyph dosage map from a square VSB shot;

DETAILED DESCRIPTION OF THE EMBODIMENTS

The improvements and advantages of the present disclosure can be accomplished by allowing other-than-normal shot dosages, and also by allowing the union of the shots to deviate from the target pattern, allowing patterns to be created from a reduced number of shots compared to the more conventional practice of using normal dosage VSB shots to completely cover the target pattern. Thus, a method and a system are provided for manufacturing a surface that addresses the prior problems such as lengthy write time and consequent high cost associated with preparing a surface.

Figure 1:
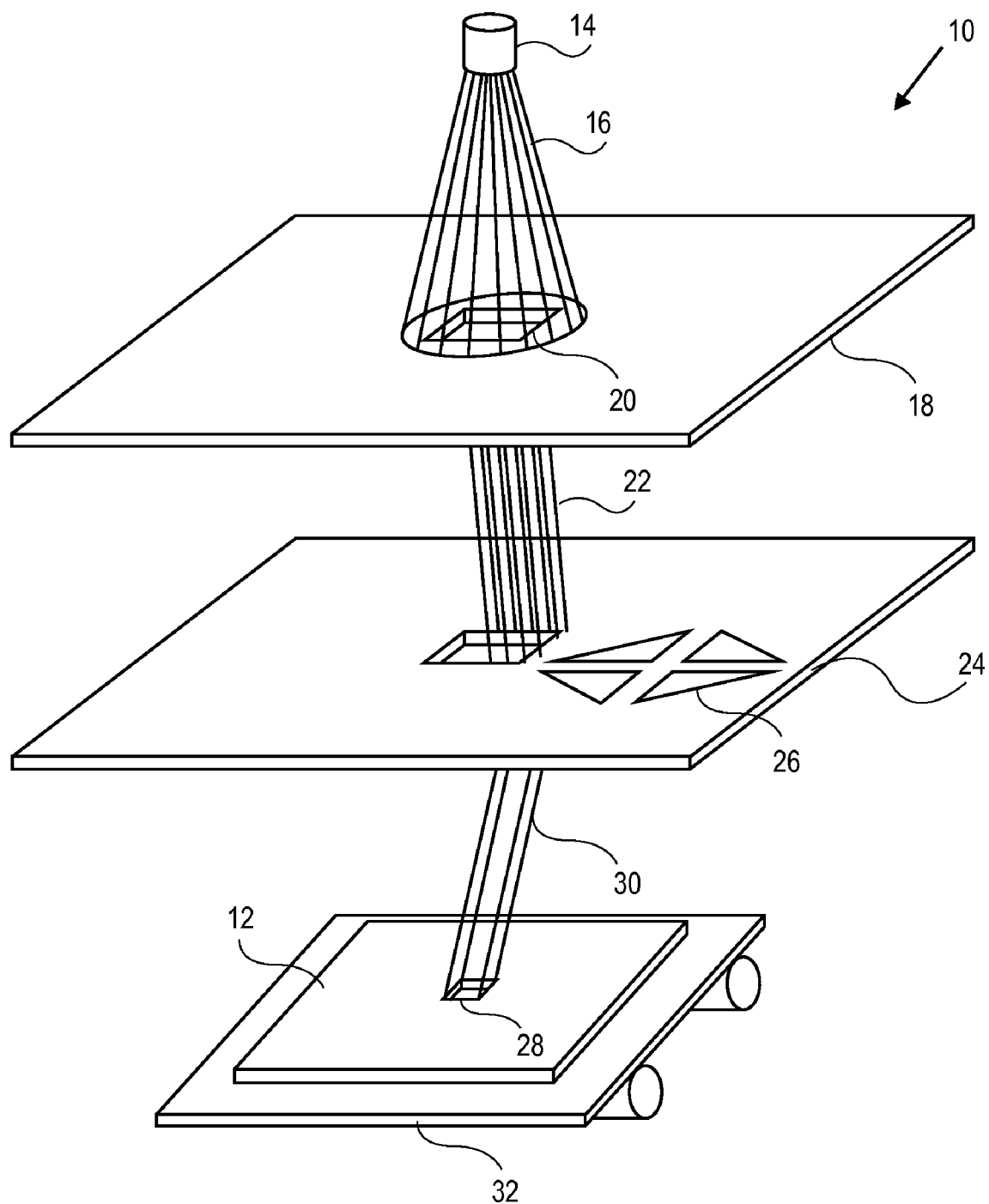
FIG. 1 illustrates a variable shaped beam charged particle beam writer system used to manufacture a surface.
Figure 2:
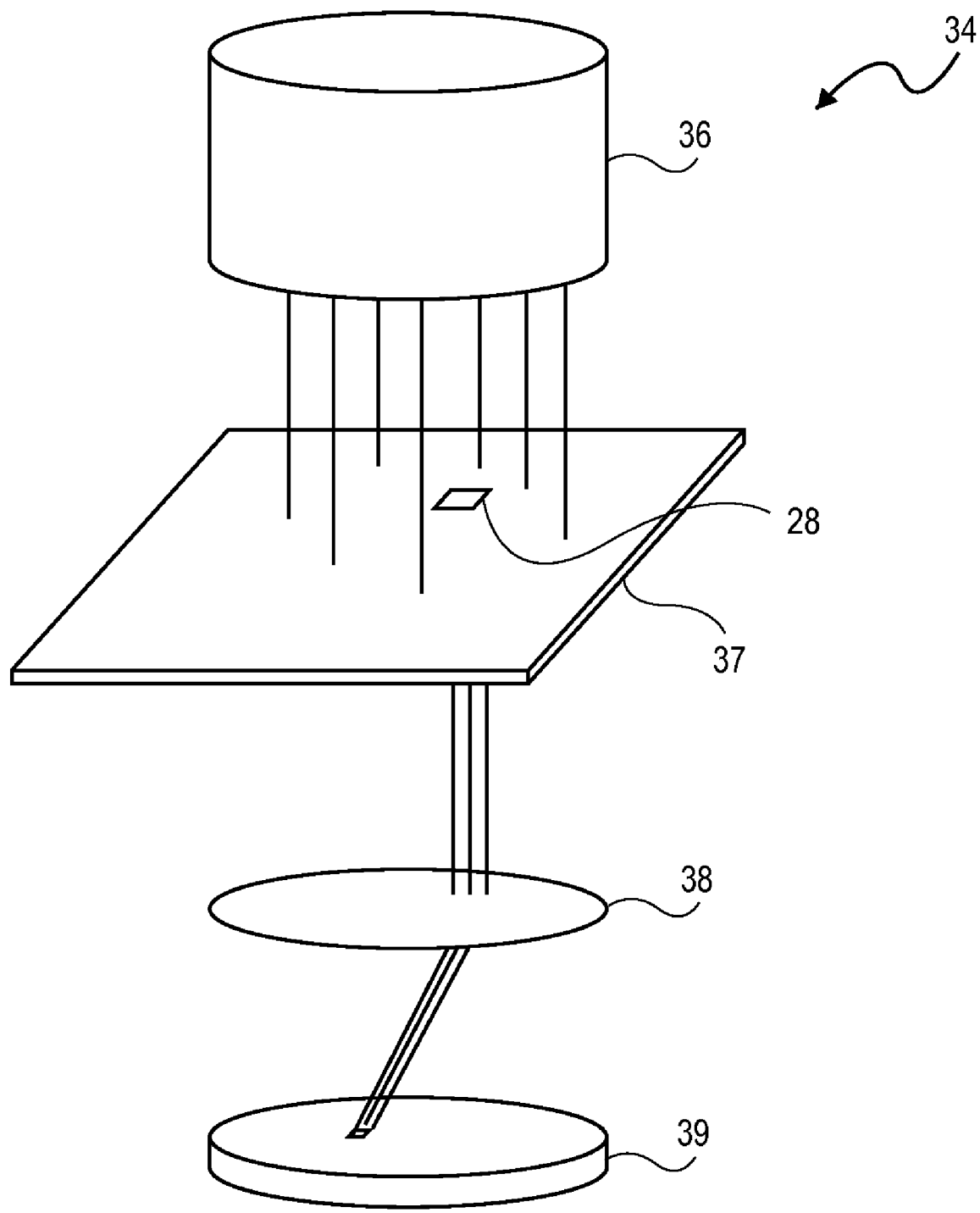
FIG. 2 illustrates an optical lithography system.

Referring now to the drawings, wherein like numbers refer to like items, FIG. 1 identifies an embodiment of a lithography system, such as a charged particle beam writer system, in this case an electron beam writer system 10, that employs a variable shaped beam (VSB) to manufacture a surface 12 according to the present disclosure. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil mask 24 has formed therein a number of apertures 26 that define various simple shapes such as rectangles and triangles. Each aperture 26 formed in the stencil mask 24 may be used to form a pattern in the surface 12. An electron beam 30 emerges from one of the apertures 26 and is directed onto the surface 12 as a pattern 28. The surface 12 is coated with resist (not shown) which reacts with the electron beam 30. The electron beam 22 may be directed to overlap a variable portion of an aperture 26, affecting the size and shape of the pattern 28. The surface 12 is mounted on a movable platform 32. The platform 32 allows surface 12 to be repositioned so that patterns which are larger than the maximum deflection capability or field size of the charged particle beam 30 may be written to surface 12. In one embodiment the surface 12 may be a reticle. In this embodiment, the reticle, after being exposed with the pattern, undergoes various manufacturing steps through which it becomes a lithographic mask. The mask may then be used in an optical lithography device or machine 34, illustrated in FIG. 2. The optical lithography machine 34 comprises an illumination source 36, the mask 37, and one or more lenses 38 which project an image of the reticle pattern 28, generally reduced in size, onto a silicon wafer 39 to produce an integrated circuit. More generally, the mask 37 is used in another device or machine to transfer the pattern 28 on to a substrate 39. In another embodiment the surface 12 is a substrate such as a silicon wafer.

Figure 3A:
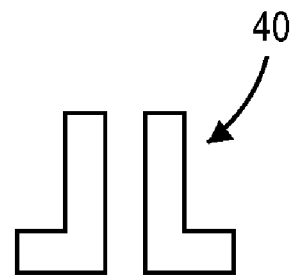
FIG. 3A illustrates a design of a pattern to be placed on a substrate.
Figure 3B:
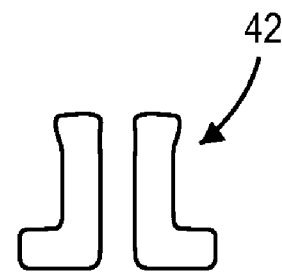
FIG. 3B illustrates a pattern formed in a reticle from the design shown in FIG. 3A.
Figure 3C:
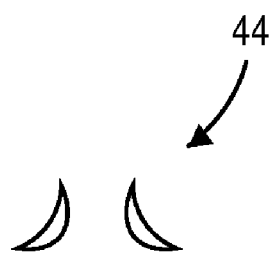
FIG. 3C illustrates a pattern formed in the photoresist of a substrate using the reticle of FIG. 3B.

As indicated above, since semiconductor and other nanotechnology manufacturers are reaching the limits of optical lithography, it is difficult to transfer an ideal pattern onto a substrate. For example, FIG. 3A illustrates an ideal pattern 40, which represents a circuit, to be formed in the resist of a substrate. When a reticle and mask are produced that attempt to have the pattern 40 formed thereon, the reticle is not a perfect representation of the pattern 40. A pattern 42 that may be formed in a reticle that attempts to represent the pattern 40 is shown in FIG. 3B. The pattern 42 has more rounded and shortened features as compared to the pattern 40. When the pattern 42 is employed in the optical lithography process, a pattern 44 is formed in the photoresist on the substrate as depicted in FIG. 3C. The pattern 44 is not very close to the ideal pattern 40, demonstrating why optical proximity correction is required.

Figure 4A:
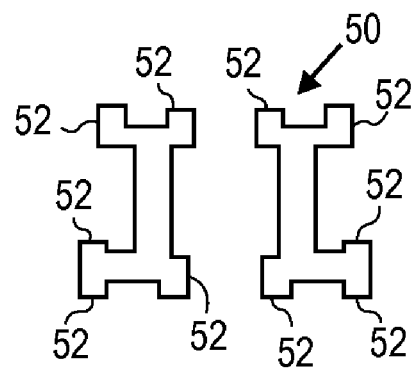
FIG. 4A illustrates an optical proximity corrected version of the pattern shown in FIG. 3A.
Figure 4B:
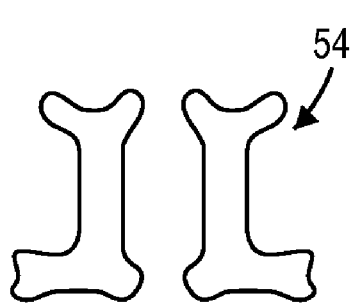
FIG. 4B illustrates an optical proximity corrected version of the pattern shown in FIG. 4A after it is formed in the reticle.
Figure 4C:
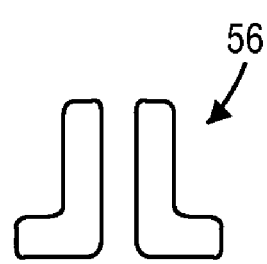
FIG. 4C illustrates a pattern formed in the photoresist of a silicon wafer using the reticle of FIG. 4B.

In an effort to compensate for the difference between the patterns 40 and 44, optical proximity correction is used. Optical proximity correction alters the design pattern so as to alter the reticle to compensate for distortions created by optical diffraction, optical interactions with neighboring shapes, and resist process effects. FIGS. 4A-4C show how optical proximity correction can be employed to enhance the optical lithography process to develop a better version of the pattern 44. In particular, FIG. 4A illustrates a pattern 50 that is an altered version of the pattern 40. The pattern 50 has a serif element 52 added to various corners of the pattern 50 to provide extra area in an attempt to reduce optical and processing effects that reduce the sharpness of the corner. When a reticle of the pattern 50 is produced it may appear in the reticle as a pattern 54 as shown in FIG. 4B. When the optical proximity corrected pattern 54 is used in an optical lithography device an output pattern 56, as depicted in FIG. 4C, is produced. The pattern 56 more resembles the ideal pattern 40 than the pattern 44 and this is due to optical proximity correction. Although using optical proximity correction is helpful, it may require that every pattern be altered or decorated which increases the time and cost to produce a reticle. Also, the various patterns formed on the reticle may properly have slight differences between them when OPC is applied and this adds to the time and expense in preparing a reticle.

Referring to FIG. 1, when a pattern is written to a resist-coated surface 12, the resulting pattern on the surface depends on the quantity of particles which reach the resist, called the exposure or dose. A dose of a variable shaped beam shot is the shutter speed, the length of time for which a given shot is being projected on the surface. "Dose correction" is a process step in which the dose amount for any given shot is modified slightly, for example, for proximity effect correction (PEC). Because of this the optimal or "normal" dose will not be the same for all shots. FIG. 5A illustrates a sample polygonal pattern 60 that is to be written on a surface. FIG. 5B illustrates a pattern 62 that will result on the reticle with a normal dose. Note that the corners of pattern 62 are somewhat rounded compared to the ideal pattern 60. FIG. 5C illustrates a pattern 64 that may result on the reticle with a less than normal dose. The pattern 64 is generally thinner and the long ends of the pattern are shortened somewhat compared to normal dose pattern 62. FIG. 5D illustrates a pattern 66 that may result on the reticle with a greater than normal dose. The pattern 66 is "fatter", slightly larger in all dimensions than the normal dose pattern 62. The differences between patterns 62, 64 and 66 are due to the response of the resist to varying doses.

The current disclosure takes advantage of this characteristic that different patterns can be written to surfaces such as a reticle by varying the shot dosage as well as by modifying the size of the VSB shot. The current disclosure combines variable dosages with a removal of the conventional constraint that shots must completely cover the target pattern, and must not cover any non-target-pattern area. By using these techniques, patterns can be formed on a surface with fewer shots than with conventional techniques. The use of these techniques, however, depends on an accurate method, such as particle beam simulation, to calculate the pattern which will be registered in the resist from the other-than-normal dosages. The computational complexity involved in the particle beam simulation and shot optimization is high, however, when applied to a full design. The complexity of the computations have heretofore pushed people into using uniform normal dosage, where particle beam simulation of the entire design is not required.

The various flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the optimization and simulation processes described in this disclosure may include iterative processes of revising and recalculating possible solutions, so as to minimize either the total number of VSB shots, or the total charged particle beam writing time, or some other parameter. In another embodiment, an initial set of VSB shots may be determined in a correct-by-construction method, so that no shot modifications are required.

One complexity of using varying dosage shots is calculating resist response for each part of the pattern. The charged particle beam system has a natural blurring radius (roughly of 20-30 nm size), causing a Gaussian distribution of transferred energy beyond the nominal boundaries of each shot. Therefore, even with non-overlapping shots, or even non-adjacent shots, an area of the resist may receive dosage from multiple shots. In this case the dosages from each of the shots must be combined to determine the total dose. For example, simple addition may be used to combine dosages. For example, FIG. 6A illustrates two VSB shot patterns 500 and 502 in close proximity. FIG. 6B illustrates the dose received along the line 503 which intersects patterns 500 and 502. In FIG. 6B the dosage registered on the resist from the VSB shot for pattern 500 is 504, and the dosage registered on the resist from the VSB shot for pattern 502 is 506. Dashed line 508 shows the threshold 508 above which the resist will register the pattern. Dotted line 510 illustrates the combination of 504 and 506 in the area where both 504 and 506 are significant. It should be noted that the combined dose 510 does not go below the resist threshold 508 at any point between the patterns 500 and 502. The combination dose curve 510 therefore shows that the resist will register patterns 500 and 502 as a single combined pattern 512, as illustrated in FIG. 6C. Other more complex mathematical functions may also be used to combine shot dosages, for example, to account for resist charging, in which negative charge, which has accumulated on the resist from earlier shots, may cause translation and distortion of later shots. FIG. 6B illustrates calculation of dosage along a single dimension. Calculation of dosage within a two-dimensional area may be done by dividing the area into an X-Y grid of equal-sized squares, calculating the dosage for each grid square, and storing these values in a two-dimensional matrix called a dosage map. Dosage maps which are known to be generated on a surface by a single VSB shot or combinations of VSB shots are called glyphs. A library of glyphs may be pre-computed and made available to optical proximity correction or mask data preparation functions. For example, pattern 512 could be stored as a glyph resulting from the shots 500 and 502.

It is significantly more challenging to predict a resulting pattern on the surface when areas on the resist receive significantly more or less than a normal dose. Particle beam exposure simulation may be used to determine the resulting pattern. This process simulates the exposure of the resist-coated surface by the charged particle beam system, accounting for the physical characteristics of the charged particle beam system and the electro-optical and chemical characteristics of the resist and the surface underlying the resist. Particle beam exposure simulation may be used to model various non-ideal effects of the charged particle beam exposure process, including forward scattering, backward scattering, resist diffusion, Coulomb effect, etching, fogging, loading and resist charging. Most of these effects are shorter-range effects, meaning that each VSB shot will affect only other nearby parts of the pattern. Back scattering, fogging and loading, however, are longer-range effects, and cannot be accurately simulated when only small parts of a pattern are considered. Resist charging, although a short-range effect, must be calculated after the final shot exposure sequence is known.

Figure 7:
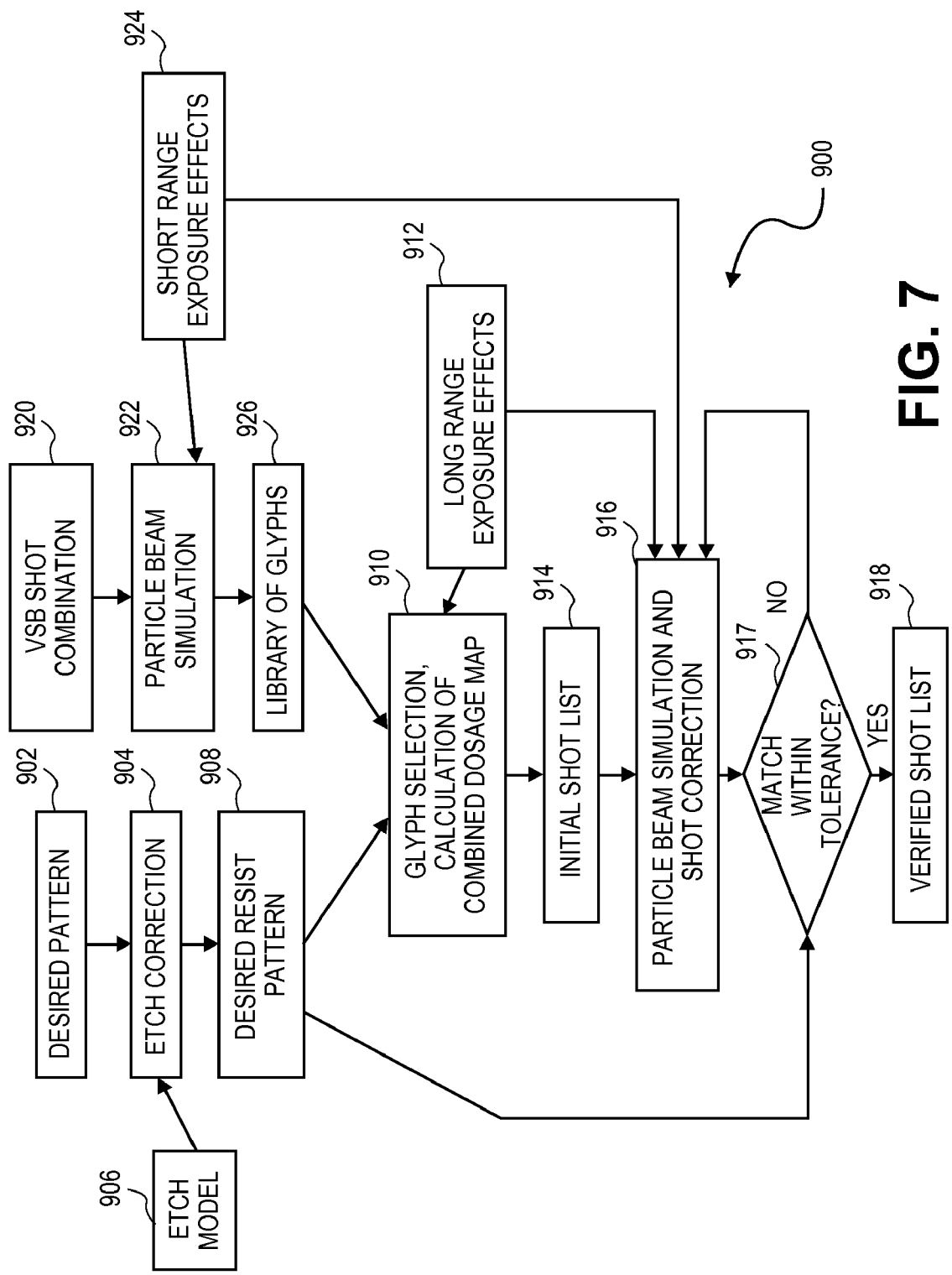
FIG. 7 illustrates an embodiment of a VSB shot fracturing conceptual flow diagram.

For example, FIG. 7 illustrates one embodiment of a flow for generating VSB shots for a pattern, a process called fracturing, by pre-calculating glyphs. In the FIG. 7 flow 900, the desired pattern 902 is the pattern that is to be formed on the surface, and is the primary input to the process. Etch correction may be calculated in step 904, based on an etch model 906. Step 904 creates a desired resist pattern 908—that is the desired pattern to be formed on the resist before etching. Desired resist pattern 908 is therefore the target pattern to be matched by a combination of glyphs. Separately, a combination of VSB shots 920 may be simulated in step 922 to create a glyph to add to the library of glyphs 926. The particle beam simulation step 922 uses models for one or more of the short-range exposure effects 924. The resulting glyphs in glyph library 926 are therefore pre-compensated for the short-range exposure effects, for the shots within the glyph. In step 910 glyphs from the glyph library are selected and placed, and the glyph dosage maps combined, so that the pattern that will be formed on the resist from the combined dosage maps will match the etch-corrected desired pattern 908 within a predetermined tolerance. Step 910 uses one or more of the long-range exposure effects 912 in selecting and placing the glyphs. The output of step 910 is an initial list of VSB shots 914, which are the shots from each of the selected glyphs. The initial set of VSB shots 914 may then be simulated in step 916 and further corrected or revised. In an optional step 917 the simulated pattern from step 916 is compared with the desired resist pattern 908 to determine if the two patterns match within the predetermined tolerance. In some embodiments of the present invention, steps 910 and 916 may use a correct-by-construction method to generate the verified shot list directly, skipping step 917. If a match within the predetermined tolerance is not found, additional correction and simulation may be done in step 916 until the particle beam simulated pattern from step 916 is within the predetermined tolerance of the etch-corrected desired pattern 908. The tolerance used in step 917 may also be adjusted if no match within the predetermined tolerance can be achieved. The result of step 917 is a verified shot list 918 which is suitable for writing to the resist-coated surface using a charged particle beam system.

FIGS. 8A-E illustrate an example of how use of varying dosage shots can reduce shot count when the shots are not constrained to fill the target pattern as closely as possible. FIG. 8A illustrates an ideal pattern 118, such as a contact, that may be generated by an electronic design-automation software system, to be used with optical lithography in forming a pattern on a substrate. The pattern 118 is in the shape of a square. FIG. 8B illustrates a curvilinear pattern 120 that may be created by OPC processing of pattern 118. Pattern 120 is to be formed on a reticle for use in making a mask for use an optical lithographic process. FIG. 8C illustrates one set 122 of non-overlapping rectangles which may be used to write pattern 120 on the reticle using VSB shots with the conventional techniques. As can be seen, the union of the set of rectangles 122 closely approximates the shape 120. However, some charged particle beam systems are relatively inaccurate when shots with high length-to-width aspect ratios, called slivers, are shot. The set of rectangles 122 is therefore not conventionally created by fracturing software. FIG. 8D illustrates another set of non-overlapping shapes—rectangles and triangles—that may be conventionally used to write shape 120 to a surface. This set of shapes can be shot using VSB technology without use of slivers. There are 7 shots in shot group 124. As can be seen, however, the unioned set of shots 124 does not very closely approximate the pattern 120. FIG. 8E illustrates a five-shot group 130 of the present disclosure that can, with proper dosages, register a pattern on the reticle which is close to the desired pattern 120. Shot group 130 consists of shot 132, shot 134, shot 136, shot 138 and shot 140. Dosages of the shots in shot group 130 may vary with respect to each other. The pattern registered on the resist is the shape 142, which is equivalent to the desired shape 120, within a pre-determined tolerance. The 5-shot group 130 can register a pattern on the resist that is closer to the desired pattern 120 than is the 7-shot group 124. This example shows how use of variable dosages and allowing the union of the shots to be different than the target pattern may be effectively used to reduce shot count. Patterns may be formed which are substantially different than a pattern which would be formed by a simple union of shots. Furthermore, curvilinear shapes can be formed, even with shots which are parallel to the axes of the Cartesian plane. The shot group 130 may be pre-computed and made available as a glyph for use with all contacts matching the contact pattern 118.

Figure 9A:
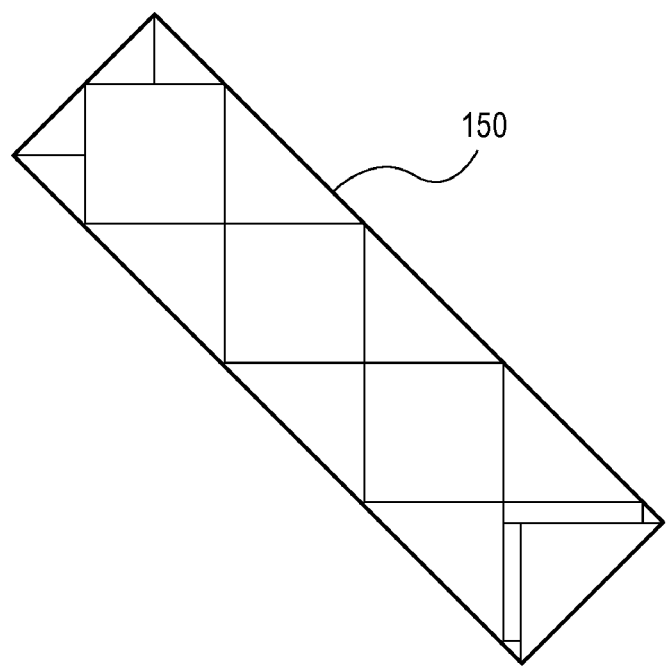
FIG. 9A illustrates a conventional set of non-overlapping VSB shots that can form the pattern of a 45 degree rotated rectangle.
Figure 9B:
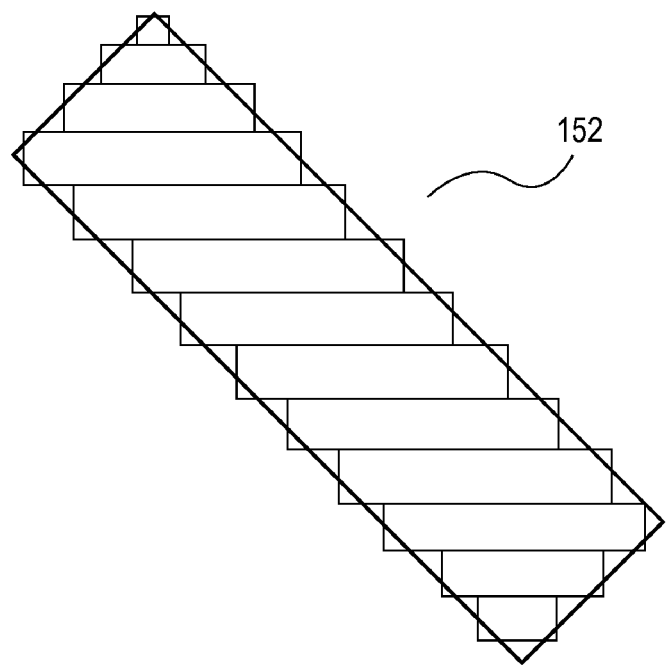
FIG. 9B illustrates a set of non-overlapping VSB shots that can form the pattern of a 45 degree rotated rectangle using an exemplary method of the current disclosure.

FIGS. 9A-B further illustrate how shot count may be reduced when using the techniques of this disclosure, as compared to conventional methods. FIG. 9A illustrates an example 150 of how conventional VSB shots may be used to form the pattern of a 45 degree rotated rectangle, such as an interconnection wire for an integrated circuit design. Both rectangular and triangular VSB shots are used in the example 150. The geometrical union of the set of VSB shots exactly covers the target pattern area. All shots may use a normal dosage. Eighteen shots are required to form this pattern, including 5 rectangular shots and 13 triangular shots. FIG. 9B illustrates an example 152 of how the same 45 degree rectangular pattern as in FIG. 9A may be formed using a set of non-overlapping shots according to the current disclosure. As can be seen in FIG. 9B, the union of the shots deviates from the target pattern area in that some shots extend beyond the boundaries of the desired pattern, and not all of the desired pattern is completely covered. Shot dosages other than a normal dosage may be used. Particle beam simulation may be used to calculate the pattern that will be formed from the set of shots, allowing verification that the pattern that will be formed is equivalent to the target pattern, within a desired tolerance. In this example 152, thirteen non-overlapping shots are used to form this pattern. Also note that the technique of FIG. 9B can be used with all-angled patterns, such as a 30 degree rotated rectangle. By contrast, the conventional method of FIG. 9A may not work well when edges have angles that are not multiples of 45 degrees, because the triangular apertures on most VSB charged particle beam systems are 45 degree right triangles.

Figure 10A:
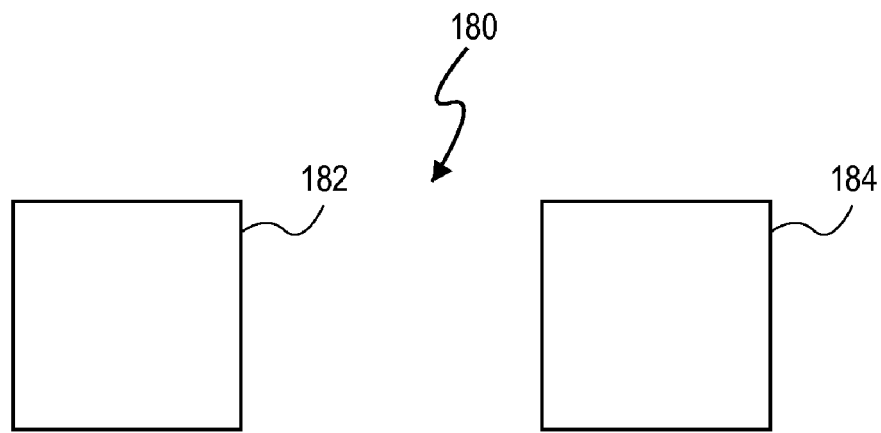
FIG. 10A illustrates a pattern to be formed on a surface.
Figure 10B:
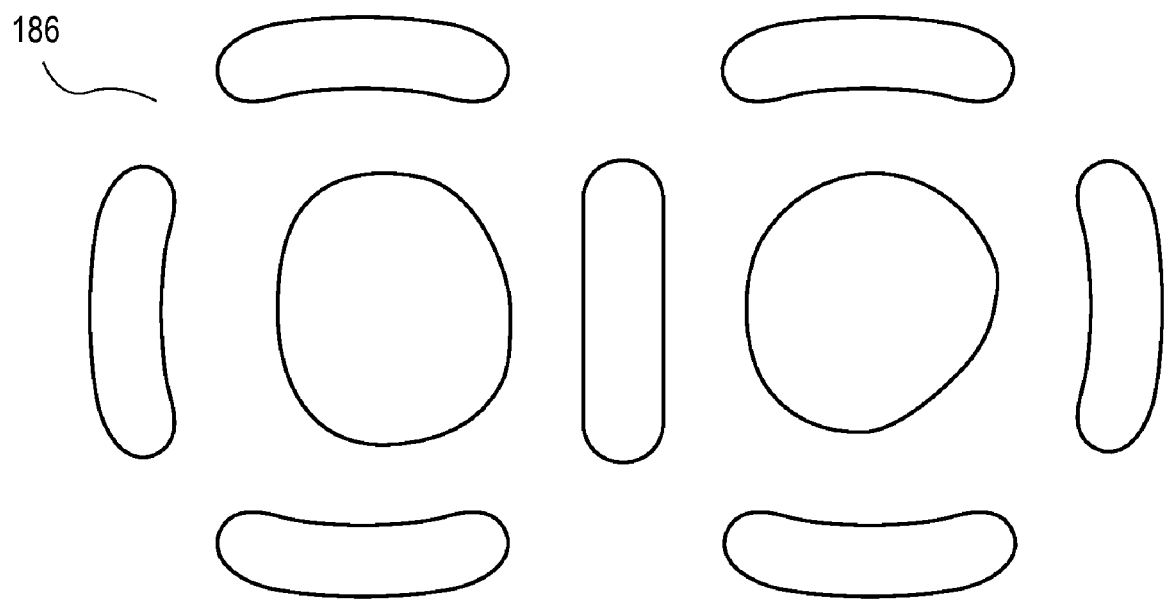
FIG. 10B illustrates a curvilinear pattern which is the result of OPC processing on the pattern of FIG. 10A.
Figure 10C:
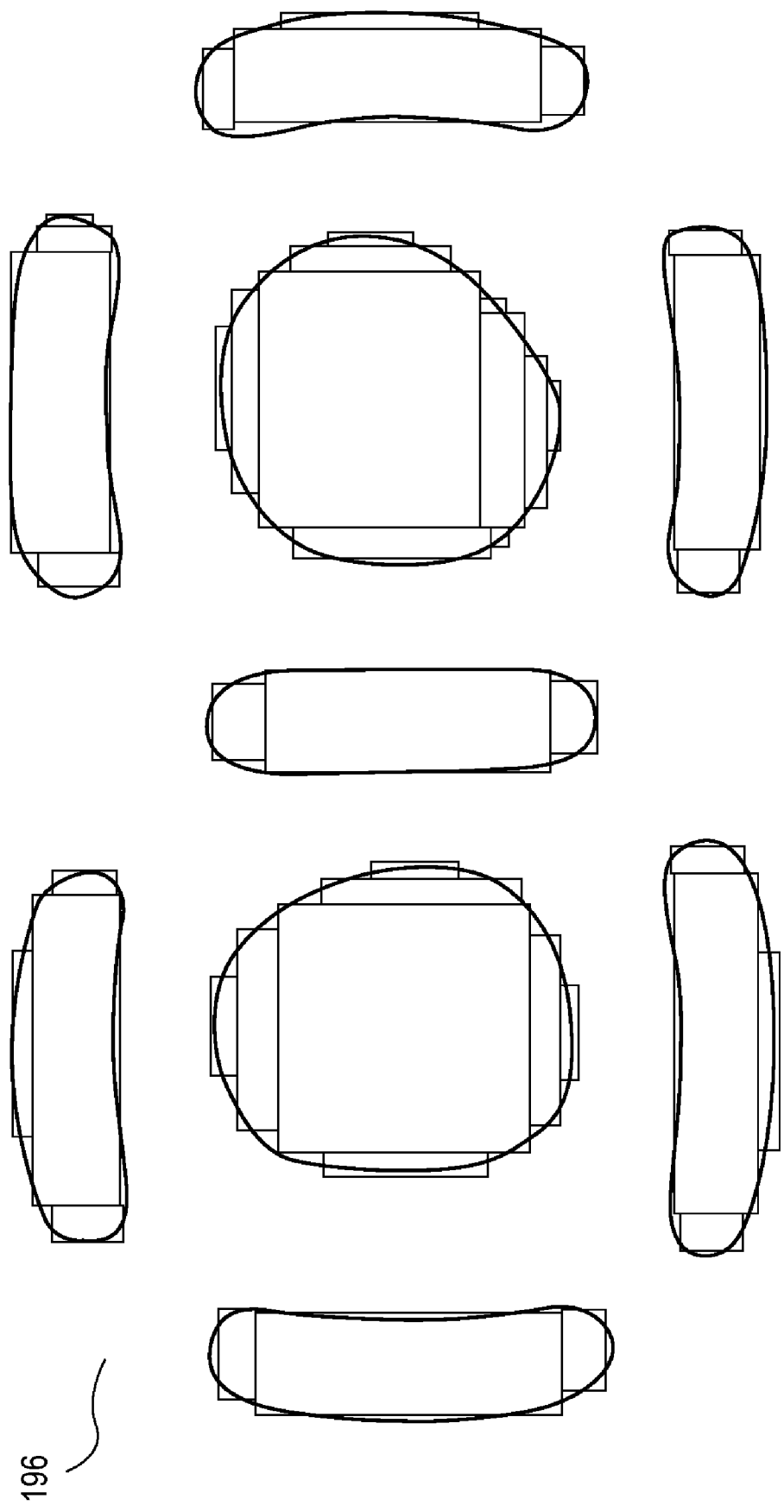
FIG. 10C illustrates a set of non-overlapping VSB shots which can form the curvilinear pattern of FIG. 10B on the surface using an exemplary method of the current disclosure.

FIGS. 10A-C illustrate an example of how a more complex pattern may be formed with VSB shots where the union of the VSB shots does not equal the target pattern. In FIG. 10A, pattern 180 consists of two square shapes 182 and 184 that, for example, may be generated by a computer-aided design software system, for use in an optical lithographic process. FIG. 10B illustrates a corresponding pattern 186 that may be produced by OPC processing of pattern 180. This example shows that OPC processing of two identical shapes 182 and 184 can produce sets of resultant shapes that are slightly different. A large number of conventional VSB shots would be required to form pattern 186 on a reticle. FIG. 10C illustrates a set of non-overlapping variable dosage VSB shots 196 which can generate the curvilinear pattern 186 on a reticle according to the present disclosure. The union of the set of shots 196 does not match the target pattern as closely as may be possible. In FIG. 10C, no minimum shot size or maximum shot aspect ratio limitation has been observed. As is shown in FIG. 10C, the set of shots 196 includes numerous narrow shots, called slivers. Unlike with overlapping shots, some slivers may be unavoidable when non-overlapping shots are used to generate curvilinear patterns.

Figure 11A:
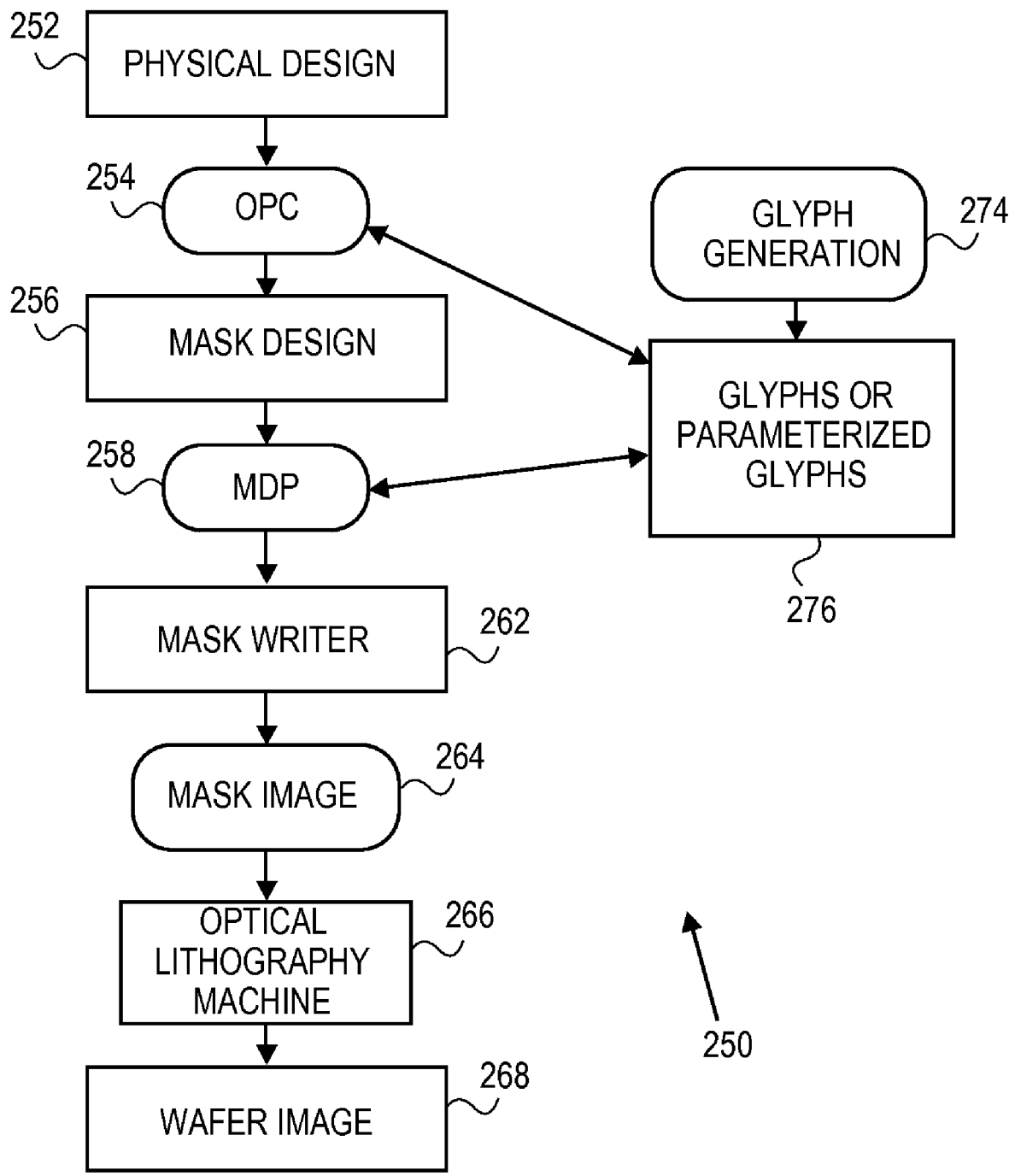
FIG. 11A illustrates an embodiment of a conceptual flow diagram of how to prepare a surface for use in fabricating a substrate such as an integrated circuit on a silicon wafer.

FIG. 11A is a conceptual flow diagram 250 of an embodiment of the present disclosure for preparing a surface for use in fabricating a substrate such as an integrated circuit on a silicon wafer using optical lithography. In a first step 252, a physical design, such as a physical design of an integrated circuit is designed. This can include determining the logic gates, transistors, metal layers, and other items that are required to be found in a physical design such as that in an integrated circuit. Next, in a step 254, optical proximity correction is determined. In an embodiment of this disclosure this can include taking as input a library of pre-calculated glyphs or parameterized glyphs, which advantageously may reduce the computing time for performing OPC. In an embodiment of this disclosure, an OPC step 254 may also include simultaneous optimization of shot count or write times, and may also include a fracturing operation, a shot placement operation allowing overlapping shots, a dose assignment operation allowing other-than-normal dosages, or may also include a shot sequence optimization operation, or other mask data preparation operations. The OPC step 254 may also use particle beam simulation. Once optical proximity correction is completed, a mask design is developed in a step 256. Then, in a step 258, a mask data preparation operation which may include a fracturing operation, a shot placement operation, a dose assignment operation, or a shot sequence optimization may take place. Either of the steps of the OPC step 254 or of the MDP step 258, or a separate program independent of these two steps 254 or 258 can include a program for determining a large number of glyphs or parameterized glyphs that can be shot on the surface to write all or a large part of the required patterns on a reticle. Combining OPC and any or all of the various operations of mask data preparation in one step is contemplated in this disclosure. Mask data preparation (MDP) step 258 may include a fracturing operation in which other-than-normal dosage assignment is allowed and in which the union of the generated set of shots may be different than the set of target patterns on the reticle, and may also include particle beam simulation. MDP step 258 may also comprise an operation to calculate a pattern on the surface based on the combination of the determined set of glyphs, and to modify the set of glyphs so as to create a calculated surface pattern that matches closely to the mask design. Mask data preparation may also comprise inputting patterns to be formed on a surface with some of the patterns being slightly different, and using particle beam exposure simulation to calculate variation in shot dose or variation in shot overlap to reduce the shot count or total write time. A set of slightly different patterns on the surface may be designed to produce substantially the same pattern on a substrate. Once the mask data preparation is completed, the surface is generated in a mask writer machine, such as an electron beam writer system. This particular step is identified as a step 262. The electron beam writer system projects a beam of electrons through apertures in a stencil mask onto a surface to form patterns on the surface, as shown in a step 264. The completed surface may then be used in an optical lithography machine, which is shown in a step 266. Finally, in a step 268, a substrate such as a silicon wafer is produced. The glyph generation step 274 provides information to a set of glyphs or parameterized glyphs in step 276. As has been previously described, the glyph generation step 274 may use particle beam simulation. Also, as has been discussed, the glyphs or parameterized glyphs step 276 provides information to the OPC step 254 or the MDP step 258.

Figure 11B:
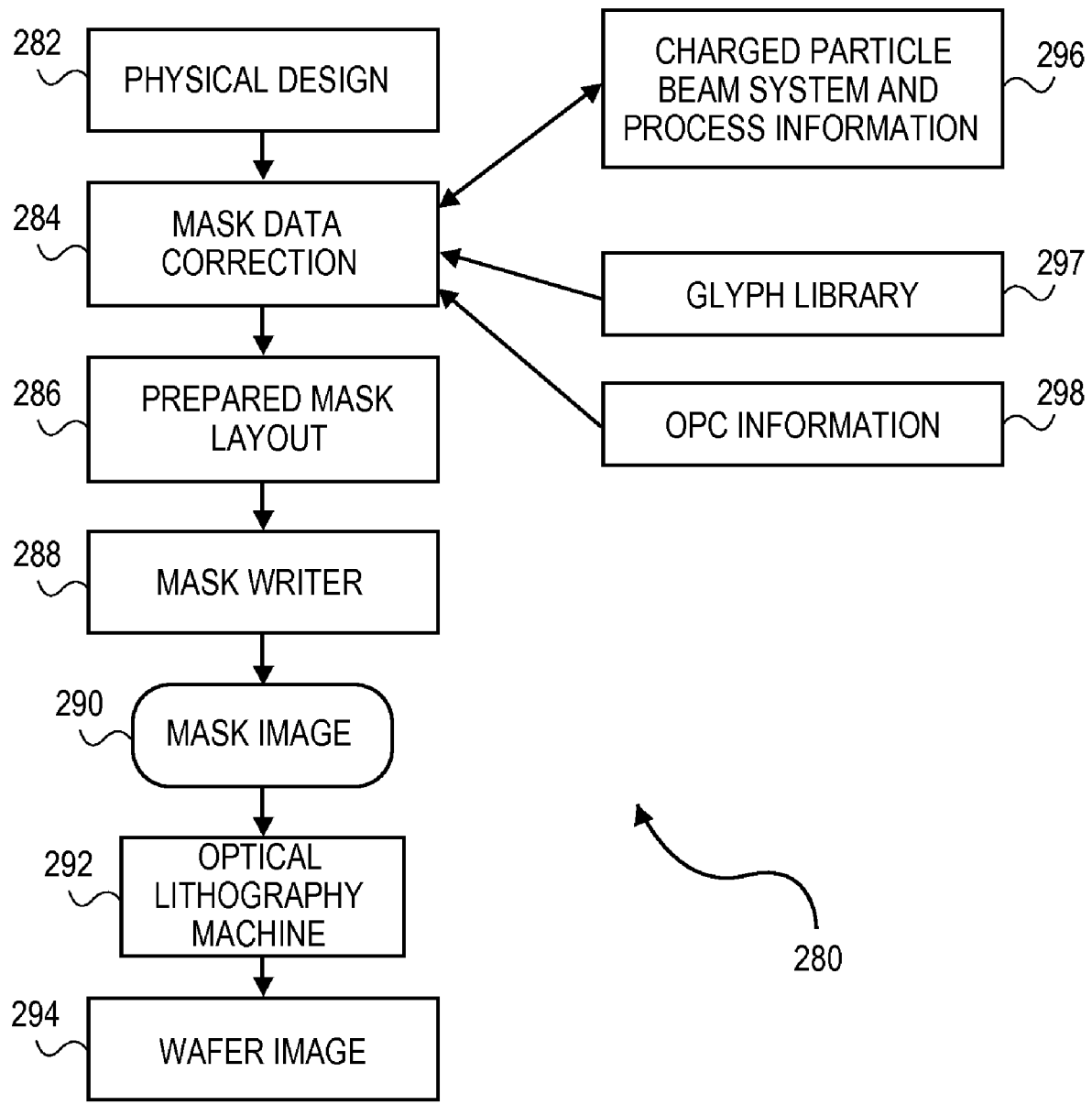
FIG. 11B illustrates another embodiment of a conceptual flow diagram of how to prepare a surface for use in fabricating a substrate such as an integrated circuit on a silicon wafer.

FIG. 11B is a more detailed flow diagram 280 of how to prepare a surface for use in fabricating a substrate such as an integrated circuit on a silicon wafer, in which OPC and MDP operations are beneficially combined in a single step. In a first step 282, a physical design, such as a physical design of an integrated circuit is obtained. The physical design may be an integrated circuit design obtained directly from conventional CAD physical design software, or it may be created from the integrated circuit design by performing, for example, Boolean operations, sizing, biasing, or retargeting of one or multiple design layers. Next, in step 284, OPC and MDP operations are performed in a single step named Mask Data Correction (MDC). Information 296 regarding the characteristics of the charged particle beam writer system and the mask manufacturing process are supplied to the MDC step. The information 296 may include, for instance, forward scattering, back scattering, resist diffusion, Coulomb effect, resist charging, fogging, maximum shot size, maximum shot aspect ratio and shot geometrical descriptions. The information 296 may also include a library of possible VSB shots. In another embodiment a library of pre-computed or pre-calculated glyphs 297 may also be supplied to the MDC step. Information 298 required to perform OPC is also supplied to the MDC step 284. The MDC step 284 uses the available information 296 regarding the charged particle beam system and the process when performing optical proximity effect correction 298. The MDC step 284 optimizes the generated set of VSB shots in order to achieve a desired wafer image 294. The desired wafer image, that is the target of the MDC step, may be the physical design 282 or may be derived from the physical design 282. The optimization may include the choice of the VSB shots, their locations, and their doses. The choice of the VSB shots, their locations, and their doses may be based on the charged particle beam system information 296, on a database of VSB shots, on a library of glyphs, or a combination thereof. The optimization of the fractured data may include the simulation of the mask image, a simulation of the wafer image based on the simulated mask image, a comparison of the simulated wafer image and the target wafer image. The result of such comparison may be used as an optimization criteria. Other optimization criteria may also include: the number of VSB shots, the minimum size of the VSB shots (i.e. slivers), the creation of identical sets of VSB shots for identical target wafer images in the same environment, and the creation of symmetrical sets of VSB shots for writing symmetrical patterns in the physical design 282. Next, the prepared mask layout 286 which is created by the MDC step 284 is used in a mask writer system 288 to generate patterns on a surface 290. The completed surface may then be used in an optical lithography machine, which is shown in step 292. Lastly an image on a wafer is produced in step 294.

Figure 12:
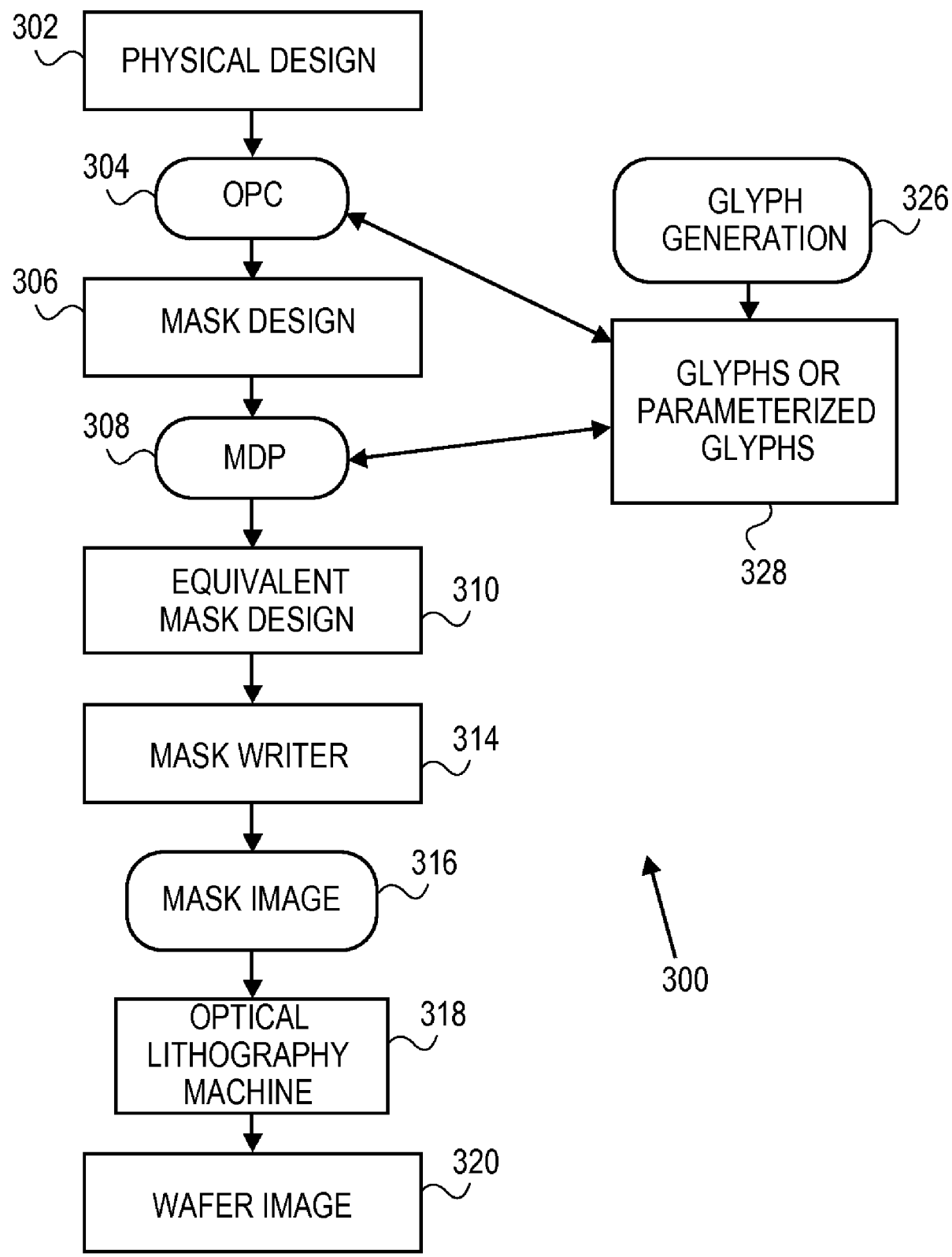
FIG. 12 illustrates yet another conceptual flow diagram of how to prepare a surface for use in fabricating a substrate such as an integrated circuit on a silicon wafer.

With reference now to FIG. 12, another conceptual flow diagram 300 of how to prepare a surface for use in fabricating a substrate such as an integrated circuit on a silicon wafer using optical lithography is shown, in which a mask design generated from mask data preparation output is compared to the post-OPC mask design based on an equivalence criteria. In a first step 302, a physical design, such as a physical design of an integrated circuit is designed. This may be the ideal pattern that the designer wants transferred onto a substrate. Next, in a step 304, optical proximity correction of the ideal pattern generated in the step 302 is determined. This can include selecting glyphs that need to be prepared. Optical proximity correction may also comprise inputting possible glyphs, the glyphs being determined using particle beam exposure simulation to calculate varying a shot dose or varying shot overlap. Further, optical proximity correction may comprise selecting a glyph from the possible glyphs, computing the transferred pattern on the substrate based on the selected glyph, and selecting another glyph if the computed pattern differs from the desired corrected pattern by greater than a predetermined threshold. Once optical proximity correction is completed a mask design is developed in a step 304. Then, in a step 306, a mask design is prepared. Once the mask design is prepared further enhancement of the mask design takes place in a mask data preparation step 308. Mask data preparation may also comprise an operation to calculate a pattern on the surface based on the combination of a selected set of glyphs, and to modify the set of glyphs so as to create a calculated surface pattern that matches closely to the mask design. Iterations, potentially including only one iteration where a correct-by-construction "deterministic" calculation is performed, of pattern matching, dose assignment, and equivalence checking may also be performed. These steps will assist in preparing an enhanced equivalent mask design.

Once the mask is enhanced, an equivalent mask design, such as a set of VSB shots, is generated in a step 310. There are two motivations for tests that can be used to determine whether the equivalent mask design is really equivalent to the mask design. One motivation is to pass mask inspection. Another motivation is to confirm that the chip or integrated circuit will function properly once it has been fabricated. The closeness to which a pattern matching operation declares a match may be determined by a set of equivalence criteria. An equivalence criteria may be driven at least partially by litho-equivalence. Litho-equivalence may be determined by a set of predetermined geometric rules, a set of mathematical equations that declare a match, a partial match, or a no match, or by running a lithography simulation of the mask design and a lithography simulation of the equivalent mask design and by comparing the two results using a set of predetermined geometric rules, or by a set of mathematical equations that declare a match, a partial match, or no match. The MDP step 308 may use a pre-determined set of glyphs, or parameterized glyphs to optimize for shot count or write time while insuring that a resulting equivalent mask design 310 is acceptable to the equivalence criteria. In another embodiment, OPC and MDP may be combined in a correct-by-construction method, in which case there may not be the mask design 306 generated separately from the equivalent mask design 310.

Once the equivalent mask design is determined to be correct, a surface is prepared in a charged particle beam writer system, such as an electron beam writer system. This step is identified as a step 314 mask writer. The electron beam writer system projects a beam of electrons through apertures in a stencil mask onto a surface to form patterns on the surface. The surface is completed in a step 316, mask image. The completed surface may then be used in an optical lithography machine, which is shown in a step 318 to transfer the patterns found on the surface to a substrate such as a silicon wafer to manufacture an integrated circuit. Finally, in a step 320, a substrate such as a semiconductor wafer is produced. The glyph generation step 326 provides information to a set of glyphs or parameterized glyphs in step 328. As has been previously described, the glyph generation step 326 may use particle beam simulation. Also, as has been discussed, the glyphs or parameterized glyphs step 328 provides information to either the OPC step 304 or the MDP step 308.

Referring again to FIG. 11A, as discussed above, in one embodiment, the OPC step 254 may include various functions of the MDP step 258. The optical proximity correction system can start with a large library of pre-computed or pre-calculated glyphs. The optical proximity correction system can then attempt to use the available glyphs as much as possible in performing optical proximity correction transformation of the original physical design of the integrated circuit to the reticle design. Glyphs may be each marked with an associated shot count and write time optimization value or values and an optical proximity correction system, a mask data preparation system, or some independent program may optimize for shot count or write time by selecting the lower shot count or write time. This optimization may be performed in a greedy manner where each glyph is chosen to optimize what is the best glyph to choose for shot count or write time with a certain order in which to choose glyphs to match a pattern, or in an iterative optimization manner such as with simulated annealing where exchanges of glyph selection optimizes the overall shot count or write time. It is possible that some desired patterns may not be able to be formed on a reticle using the available set of glyphs, and that such patterns may need to be formed by use of individual VSB shots not part of any pre-computed glyph.

Figure 15:
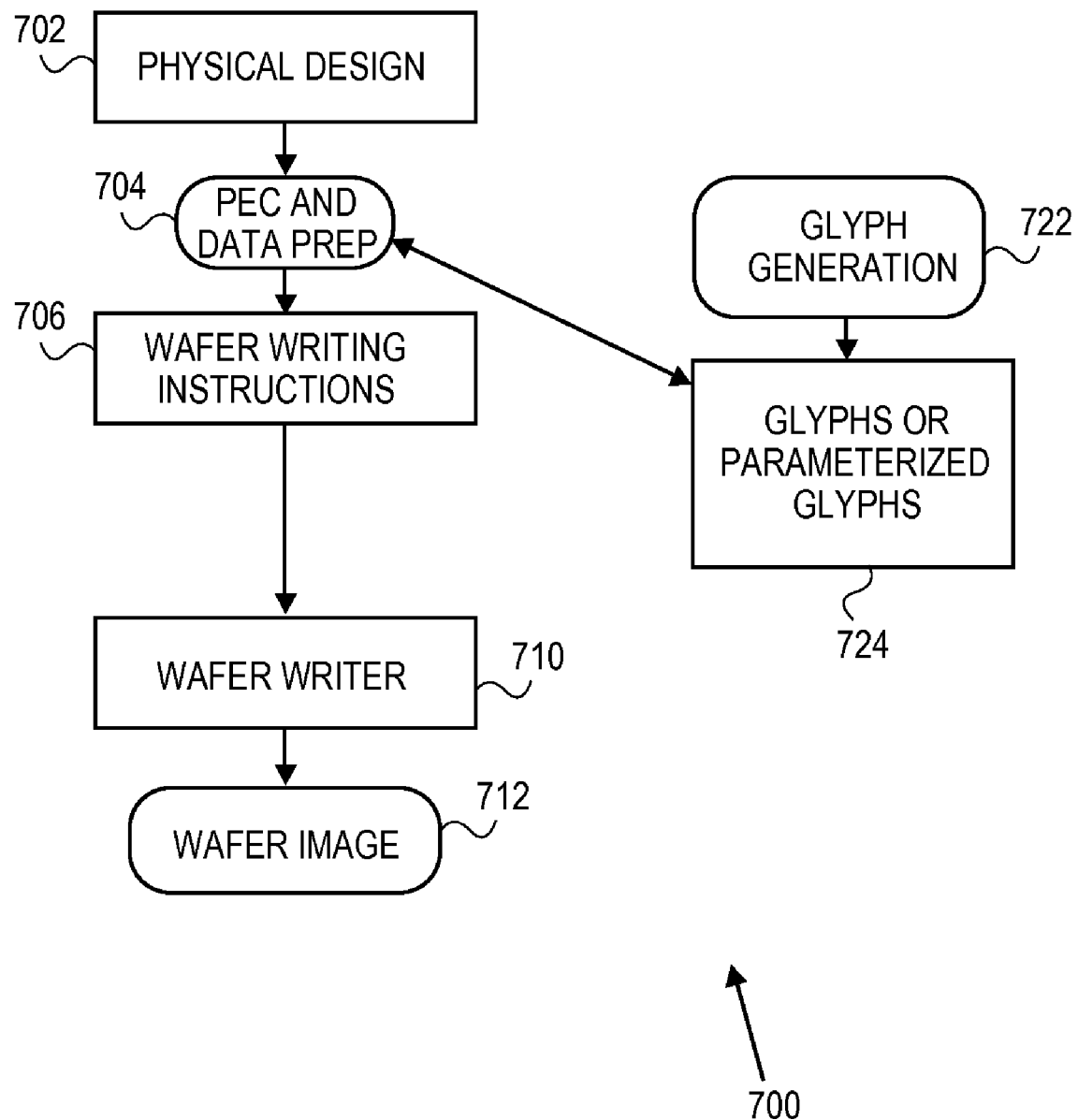
FIG. 15 illustrates a further embodiment of a conceptual flow diagram of how to prepare a surface in fabricating a substrate such as an integrated circuit on a silicon wafer.

Referring now to FIG. 15, another conceptual flow diagram 700 of how to prepare a surface which is directly written on a substrate such as a silicon wafer is shown. In a first step 702, a physical design, such as a physical design of an integrated circuit is determined. This may be an ideal pattern that the designer wants transferred onto a substrate. Next, in a step 704, proximity effect correction (PEC), and other data preparation (DP) steps are performed to prepare input data to a substrate writing device, where the result of the physical design contains a multiplicity of patterns that are slightly different. The step 704 may also comprise inputting possible glyphs or parameterized glyphs from step 724, the glyphs being based on VSB shots, and the glyphs being determined using a calculation of varying a shot dose or varying a shot position in glyph generation step 722. The step 704 may also comprise an operation to calculate a pattern on the wafer based on the combination of a selected set of glyphs, and to modify the set of glyphs so as to create a calculated wafer pattern that matches closely to the physical design created in the step 702. Iterations, potentially including only one iteration where a correct-by-construction "deterministic" calculation is performed, of pattern matching, dose assignment, and equivalence checking may also be performed. The result of step 704 is a set of wafer writing instructions 706. Wafer writing instructions 706 are then used to prepare a wafer in a wafer writer machine, such as an electron beam writer system. This step is identified as the step 710. The electron beam writer system projects a beam of electrons through an adjustable aperture onto a surface to form patterns in a surface. The surface is completed in a step 712. The glyph generation step 722 provides information to a set of glyphs or parameterized glyphs in step 724. The glyphs or parameterized glyphs step 724 provides information to the PEC and Data Prep step 704. The step 710 may include repeated application as required for each layer of processing, potentially with some processed using the methods described in association with FIGS. 11A and 12, and others processed using the methods outlined above with respect to FIG. 15, or others produced using any other wafer writing method to produce integrated circuits on the silicon wafer.

Glyph creation is the process of calculating a dosage map for a shot or group of shots and storing the shot information and the calculated dosage map for future use. The calculated dosage map represents the dosage that would be received by a resist-coated surface from the shots comprising the glyph. FIGS. 13A & B illustrate examples of glyphs that may be used by optical proximity correction, fracturing, proximity effect correction, or any other steps of mask data preparation. FIG. 13A illustrates an example of a two-dimensional dosage map 600 of one rectangular VSB shot. The shot's nominal outline 602 is also shown. The nominal dosage of the VSB shot in this example is 1.0 times a normal dosage. The value shown in each grid represents the calculated fraction of a normal dosage that the surface will receive at an X,Y sample point on the surface. As can be seen, significant energy is recorded outside the nominal boundary of the VSB shot. If this glyph is shot onto a resist-coated surface which has a resist threshold of 0.6, with no other shots contributing significant dosage, the resist will register a pattern similar to the rectangular shot outline 602. FIG. 13B illustrates an example of a glyph dosage map 620 of a single square VSB shot, where the nominal shot outline 622 is also shown. The nominal dosage of the shot in this example is 0.6 times a normal dosage. If this glyph is shot onto a resist-coated surface which has a resist threshold of 0.5, with no other shots contributing significant dosage, the resist will register a pattern that is slightly smaller on all sides than the shot outline, and in which the corners of the pattern are rounded off. The dosage grids 600 and 620 are for illustration only, and are coarser than practical. Grid sizes between 1 nm and 40 nm, in the scale of the surface, may be useful for calculating glyph dosages for modern semiconductor processes. Additionally, in one embodiment of glyph creation, the dosages may not be stored as a two-dimensional dosage map as shown in 600 and 620, but may be stored as a set of instructions for creating a two-dimensional set of dosage values.

Figure 14A:
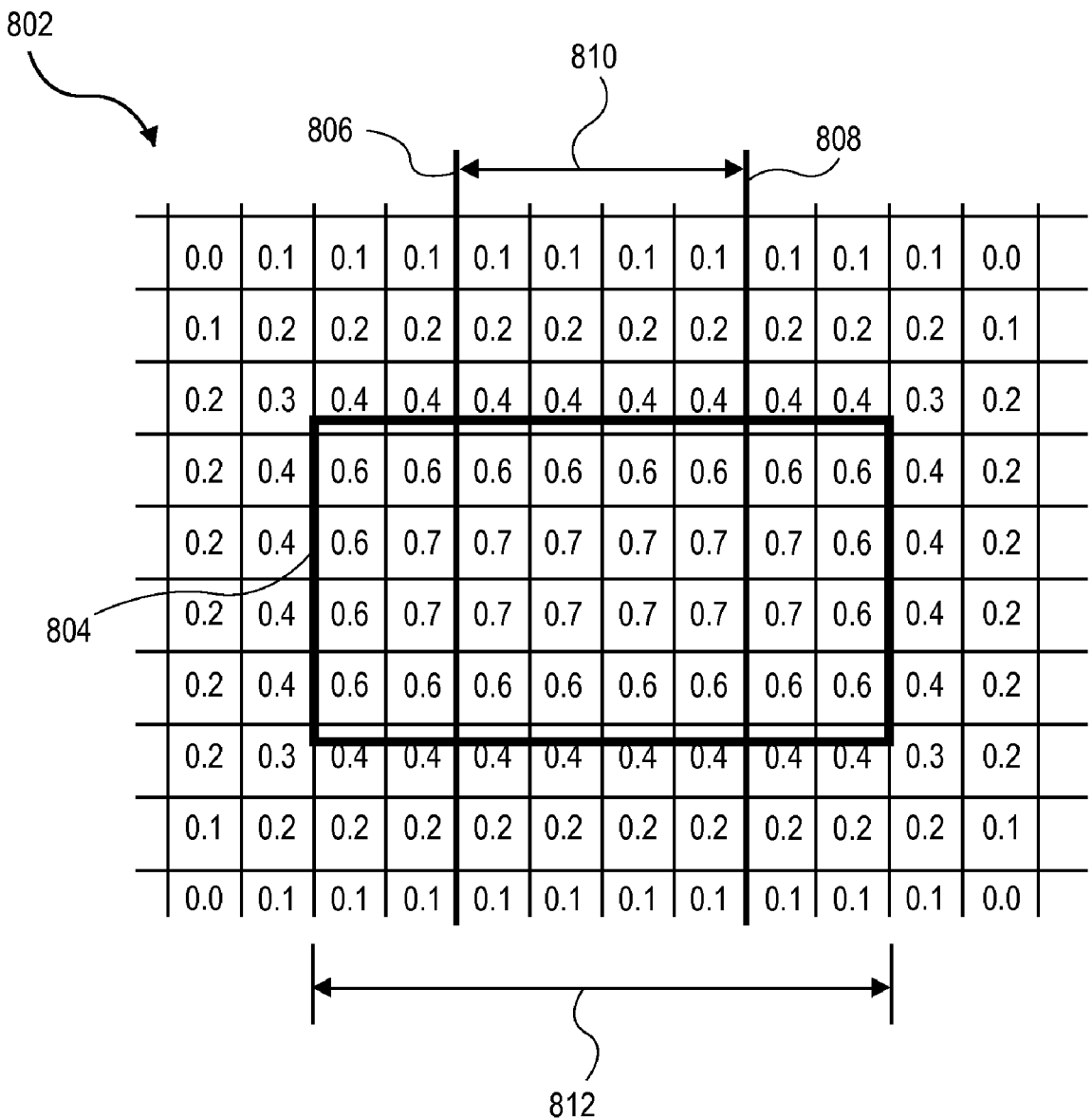
FIG. 14A illustrates a parameterized glyph dosage map.
Figure 14B:
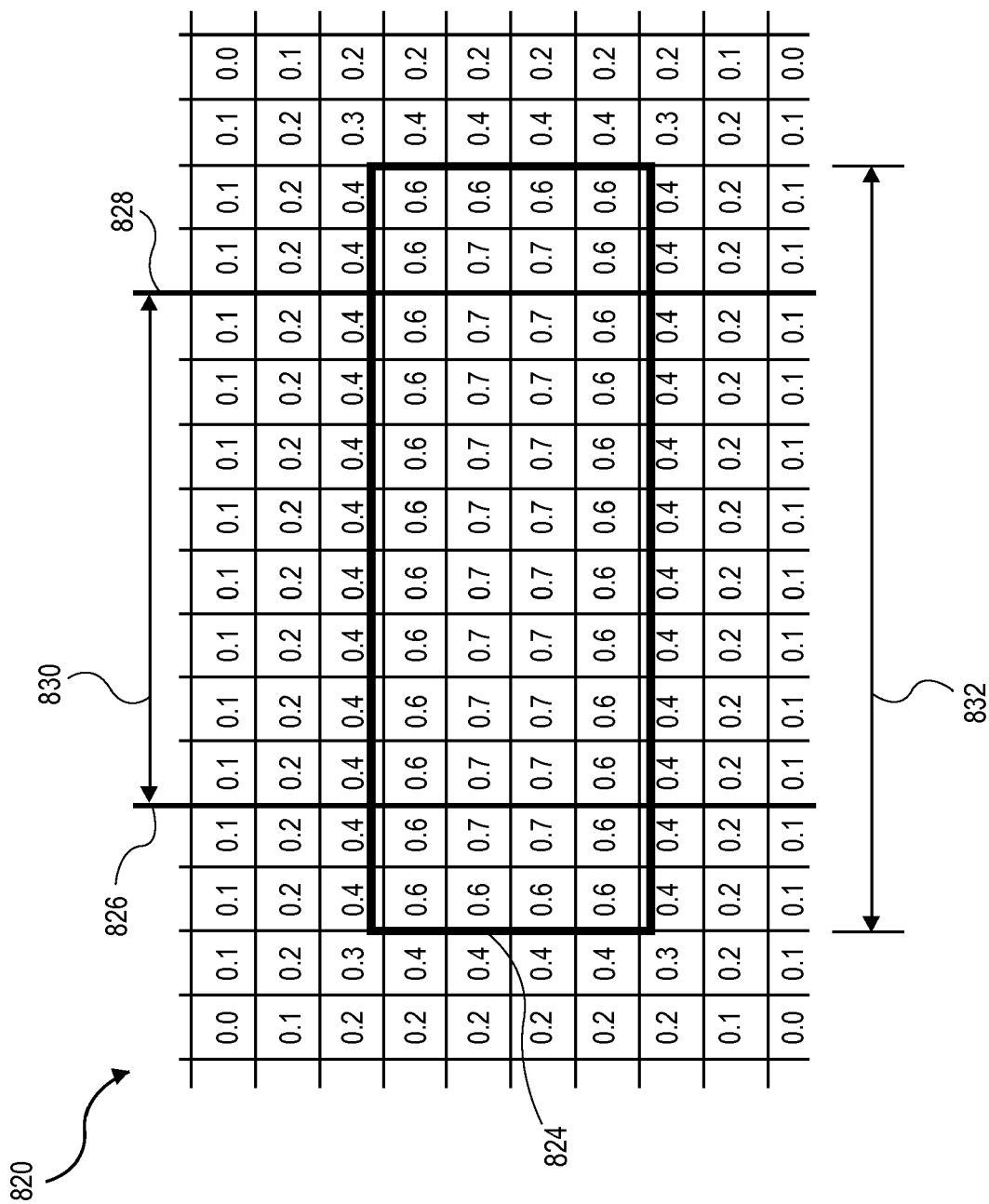
FIG. 14B illustrates another dosage map for the parameterized glyph of FIG. 14A.

FIGS. 14A & B illustrate an example of a parameterized glyph. The dosage map 802 illustrated in FIG. 14A is for a rectangular shot 804 of width 812, or eight grid units in this example. The two vertical lines 806 and 808 define a region of the dosage map which is of width 810, or four grid units in this example. Within this region 810 of the dosage map 802, all grid squares in each row have identical dosage values. FIG. 14B illustrates a dosage map 820 for a rectangular shot 824 of width 832, or twelve grid units in this example. The dosage map 820 is similar to the dosage map 802, including the dosage values of the grid squares, except that between vertical lines 826 and 828, dosage map 820 contains four more grid columns than the dosage map 802 contains between lines 806 and 808. This "stretchable" portion of the dosage map 820 is of width 830, or eight grid units in this example. By identifying a stretchable or parameterizable region where the dosages are identical along the stretchable dimension, such as the region between lines 806 and 808 of FIG. 14A or between lines 826 and 828 of FIG. 14B, a dosage map for a rectangular shot of the same height as shots 804 and 824 can be generated for shots with any width greater than 812. Limitations of the charged particle beam system may further restrict the size of the rectangular shots for which this method can be used to generate a dosage map. In other embodiments, a repeated dosage pattern in the dosage map may allow dosage maps to be generated for single shots or groups of shots of only discrete lengths, rather than of a continuous length such as the example of FIGS. 14A & B. This example shows how a dosage map for a parameterized glyph may be generated. In other embodiments, other dimensions may be parameterized, such as height or diameter.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present system and method for design and manufacture of a reticle using variable shaped beam lithography may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Thus, it is intended that the present subject matter covers such modifications and variations as come within the scope of the appended claims and their equivalents.

What is claimed is:

1. A method for fracturing or mask data preparation or proximity effect correction comprising:
   inputting a desired pattern to be formed on a reticle; and
   determining a plurality of non-overlapping variable shaped beam (VSB) shots, wherein the union of any subset of the plurality of VSB shots, each shot in the subset being oversized or being undersized or being the originally-determined size, is different than the desired pattern.

2. The method of claim 1 further comprising:
   calculating a calculated pattern on the reticle from the plurality of VSB shots; and
   revising the plurality of VSB shots and recalculating the calculated pattern if the calculated pattern differs from the desired pattern by more than a predetermined tolerance.

3. The method of claim 1 wherein the step of calculating comprises charged particle beam simulation.

4. The method of claim 3 wherein the charged particle beam simulation includes at least one of a group consisting of forward scattering, backward scattering, resist diffusion, Coulomb effect, etching, fogging, loading and resist charging.

5. The method of claim 1 wherein the desired pattern is curvilinear.

6. The method of claim 1 wherein each VSB shot comprises a dose, and wherein the doses of the VSB shots are allowed to vary with respect to each other.

7. The method of claim 1 wherein at least one of the steps of determining and revising comprises using an optimization technique to determine the plurality of VSB shots.

8. The method of claim 7 wherein the plurality of VSB shots is minimized in number.

9. The method of claim 7 wherein the plurality of VSB shots having an aspect ratio greater than a predetermined maximum is minimized in number.

10. The method of claim 1 further comprising inputting a set of glyphs, and wherein in the step of determining, the set of shots includes a glyph.

11. A method for manufacturing a reticle using charged particle beam lithography, the method comprising:
    inputting a desired pattern to be formed on the reticle;
    determining a plurality of non-overlapping variable shaped beam (VSB) shots, wherein the union of any subset of the plurality of VSB shots, each shot in the subset being oversized or being undersized or being the originally-determined size, is different than the desired pattern; and
    forming the pattern on the reticle with the plurality of VSB shots.

12. The method of claim 11 further comprising:
    calculating a calculated pattern on the reticle from the plurality of VSB shots; and revising the plurality of VSB shots and recalculating the calculated pattern if the calculated pattern differs from the desired pattern by more than a predetermined tolerance.

13. The method of claim 11 wherein the step of calculating comprises charged particle beam simulation.

14. The method of claim 13 wherein the charged particle beam simulation includes at least one of a group consisting of forward scattering, backward scattering, resist diffusion, Coulomb effect, etching, fogging, loading and resist charging.

15. The method of claim 11 wherein the desired pattern is curvilinear.

16. The method of claim 11 wherein each VSB shot comprises a dose, and wherein the doses of the VSB shots are allowed to vary with respect to each other.

17. The method of claim 11 wherein at least one of the steps of determining and revising comprises using an optimization technique to determine the plurality of VSB shots.

18. The method of claim 17 wherein the plurality of VSB shots is minimized in number.

19. The method of claim 11 wherein the plurality of VSB shots is constrained to be symmetrical when the desired pattern is symmetrical.

20. The method of claim 11 wherein the step of determining uses a correct-by-construction deterministic technique.

21. A method for optical proximity correction (OPC) of a design comprising a pattern to be formed on a surface, the surface to be used in an optical lithographic process to transfer the pattern to a substrate, the method comprising:
    inputting a desired pattern for the substrate; and
    determining a plurality of non-overlapping variable shaped beam (VSB) shots, wherein the union of any subset of the plurality of VSB shots, each shot in the subset being oversized or being undersized or being the originally-determined size, is different than an OPC-corrected version of the desired pattern for the substrate.

22. The method of claim 21 further comprising:
    calculating a calculated pattern on the surface from the plurality of VSB shots; and
    revising the plurality of VSB shots and recalculating the calculated pattern if the calculated pattern differs from the OPC-corrected version of the desired pattern for the substrate by more than a predetermined tolerance.

23. The method of claim 21 wherein each VSB shot comprises a dose, and wherein the doses of the VSB shots are allowed to vary with respect to each other.

24. A system for fracturing or mask data preparation or proximity effect correction comprising:
    an input device capable of receiving a desired pattern to be formed on a reticle; and
    a computation device capable of determining a plurality of non-overlapping variable shaped beam (VSB) shots, wherein the union of any subset of the plurality of VSB shots, each shot in the subset being oversized or being undersized or being the originally-determined size, is different than the desired pattern.

25. The system of claim 24 wherein each VSB shot comprises a dose, and wherein the doses of the VSB shots are allowed to vary with respect to each other.

* * * * *